United States Patent
Kim et al.

(10) Patent No.: US 9,673,120 B2
(45) Date of Patent: Jun. 6, 2017

(54) EPOXY RESIN COMPOSITION FOR ENCAPSULATING SEMICONDUCTOR DEVICE AND SEMICONDUCTOR PACKAGE ENCAPSULATED USING THE SAME

(71) Applicant: SAMSUNG SDI CO., LTD., Yongin-si, Gyeonggi-do (KR)

(72) Inventors: Sang Jin Kim, Uiwang-si (KR); Eun Jung Lee, Uiwang-si (KR); Yong Han Cho, Uiwang-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/706,663

(22) Filed: May 7, 2015

(65) Prior Publication Data

US 2016/0093547 A1 Mar. 31, 2016

(30) Foreign Application Priority Data

Sep. 25, 2014 (KR) .................. 10-2014-0128685

(51) Int. Cl.
*H01L 23/28* (2006.01)
*C08L 83/00* (2006.01)
(Continued)

(52) U.S. Cl.
CPC ............ *H01L 23/296* (2013.01); *C08L 63/04* (2013.01); *C09D 163/04* (2013.01); *H01L 24/32* (2013.01);
(Continued)

(58) Field of Classification Search
CPC ..... H01L 23/295; H01L 23/296; H01L 33/56; H01L 24/32; C09D 163/04; C08L 63/04
See application file for complete search history.

(56) References Cited

U.S. PATENT DOCUMENTS 5,739,585 A * 4/1998 Akram ............... H01L 23/13
257/680
7,095,125 B2 * 8/2006 Osada ............... C08L 63/00
257/793

(Continued)

FOREIGN PATENT DOCUMENTS

| JP | 2009-126980 A | 6/2009 |
| JP | 2009-173773 A | 8/2009 |
| KR | 10-2009-0082868 A | 7/2009 |
| KR | 10-2014-0082521 A | 7/2014 |
| TW | 200936716 A | 9/2009 |
| TW | 201127901 A | 8/2011 |

OTHER PUBLICATIONS

Office Action mailed Sep. 9, 2015 in corresponding Taiwanese Patent Application No. 104114205.

*Primary Examiner* — Alonzo Chambliss
(74) *Attorney, Agent, or Firm* — Lee & Morse, P.C.

(57) ABSTRACT

An epoxy resin composition for encapsulating a semiconductor device and a semiconductor package, the composition including an epoxy resin; a polyorganosiloxane resin represented by Formula 3, below; a curing agent; a curing accelerator; and an inorganic filler:

[Formula 3]

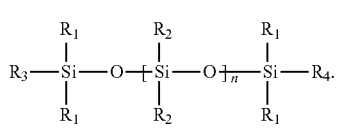

10 Claims, 1 Drawing Sheet

(51) Int. Cl.
    *C08G 77/20*     (2006.01)
    *H01L 23/29*     (2006.01)
    *C08L 63/04*     (2006.01)
    *H01L 23/00*     (2006.01)
    *H01L 33/56*     (2010.01)
    *C09D 163/04*     (2006.01)

(52) U.S. Cl.
    CPC .......... *H01L 33/56* (2013.01); *C08L 2205/05* (2013.01); *H01L 23/295* (2013.01); *H01L 2224/291* (2013.01); *H01L 2224/32225* (2013.01); *H01L 2924/00015* (2013.01); *H01L 2924/01014* (2013.01); *H01L 2924/0665* (2013.01); *H01L 2924/0715* (2013.01); *H01L 2924/186* (2013.01)

(56) References Cited

U.S. PATENT DOCUMENTS

| | | | | |
|---|---|---|---|---|
| 8,877,877 B2 * | 11/2014 | Koh | ................ | C08L 83/04 525/100 |
| 2003/0187107 A1 * | 10/2003 | Sumiyoshi | ........... | C08K 5/5399 524/95 |
| 2009/0123764 A1 * | 5/2009 | Morita | .................. | C08G 77/20 428/446 |
| 2010/0200882 A1 * | 8/2010 | Kotani | ............... | C08G 59/3245 257/98 |

\* cited by examiner

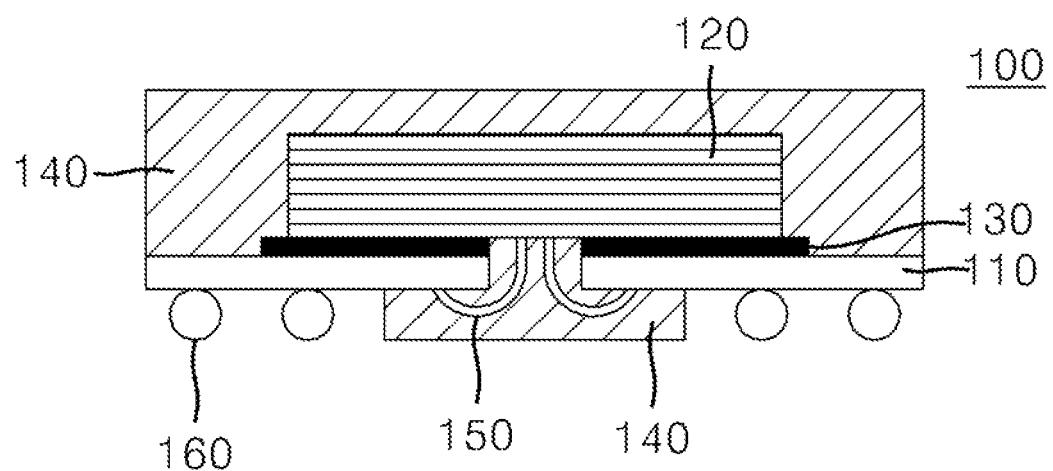

EPOXY RESIN COMPOSITION FOR ENCAPSULATING SEMICONDUCTOR DEVICE AND SEMICONDUCTOR PACKAGE ENCAPSULATED USING THE SAME

CROSS-REFERENCE TO RELATED APPLICATION

Korean Patent Application No. 10-2014-0128685, filed on Sep. 25, 2014, in the Korean Intellectual Property Office, and entitled: "Epoxy Resin Composition for Encapsulating Semiconductor Device and Semiconductor Package Encapsulated Using the Same," is incorporated by reference herein in its entirety.

BACKGROUND

1. Field

Embodiments relate to an epoxy resin composition for encapsulating a semiconductor device and a semiconductor package encapsulated using the same.

2. Description of the Related Art

Recently, with general use of thin, small scale portable digital devices, a semiconductor package may be light, thin, and miniaturized in order to enhance mounting efficiency per unit volume of the semiconductor package mounted in the devices.

SUMMARY

Embodiments are directed to an epoxy resin composition for encapsulating a semiconductor device and a semiconductor package encapsulated using the same.

The embodiments may be realized by providing an epoxy resin composition for encapsulating a semiconductor device, the composition including an epoxy resin; a polyorganosiloxane resin represented by Formula 3, below; a curing agent; a curing accelerator; and an inorganic filler,

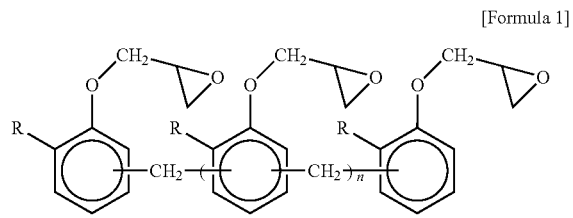

[Formula 3]

wherein $R_1$, $R_2$, $R_3$, and $R_4$ each independently include a substituted or unsubstituted $C_1$ to $C_{10}$ alkyl group, a substituted or unsubstituted $C_3$ to $C_{20}$ cycloalkyl group, a substituted or unsubstituted $C_6$ to $C_{20}$ aryl group, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, a substituted or unsubstituted $C_2$ to $C_{20}$ alkenyl group, a substituted or unsubstituted $C_2$ to $C_{20}$ alkynyl group, a substituted or unsubstituted $C_1$ to $C_{10}$ alkoxy group, an epoxy-substituted organic group, or a hydroxyl-substituted organic group; provided that at least one of $R_3$ or $R_4$ includes a vinyl group-containing organic group; and n is 0 to about 100 on average.

The polyorganosiloxane resin may be represented by Formula 4:

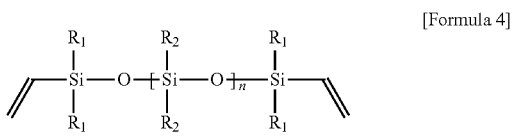

[Formula 4]

wherein n, $R_1$, and $R_2$ are the same as defined with respect to Formula 3.

In Formula 3, at least one $R_2$ may be an epoxy-substituted organic group.

The polyorganosiloxane resin may be present in the composition in an amount of about 0.1 wt % to about 1.0 wt %, based on a total weight of the composition.

The composition may include about 3 wt % to about 15 wt % of the epoxy resin; about 0.1 wt % to about 1.0 wt % of the polyorganosiloxane resin; about 2 wt % to about 10 wt % of the curing agent; about 0.01 wt % to about 1.0 wt % of the curing accelerator; and about 82 wt % to about 92 wt % of the inorganic filler, all wt % being based on a total weight of the composition.

The epoxy resin may include at least one of an ortho-cresol novolac epoxy resin represented by Formula 1 or a phenolaralkyl epoxy resin represented by Formula 2:

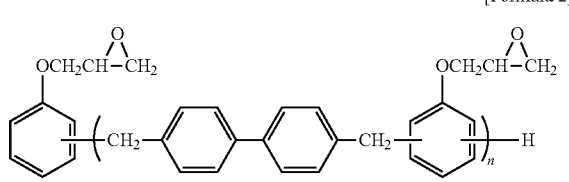

[Formula 1]

wherein, in Formula 1, R may be a $C_1$ to $C_4$ alkyl group and n may be 0 to about 7 on average.

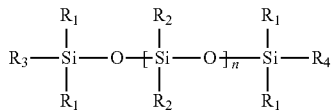

[Formula 2]

wherein, in Formula 2, n may be about 1 to about 7 on average.

The curing agent may include a phenolaralkyl type phenol resin, a xylok type phenol resin, a phenol novolac type phenol resin, a cresol novolac type phenol resin, a naphthol type phenol resin, a terpene type phenol resin, a polyfunctional phenol resin, a polyaromatic phenol resin, a dicyclopentadiene phenol resin, a terpene modified phenol resin, a dicyclopentadiene modified phenol resin, a novolac type phenol resin prepared from bisphenol A and resol, a multivalent phenol compound, an acid anhydride, metaphenylenediamine, diaminodiphenylmethane, or diaminodiphenylsulfone.

The curing accelerator may include a tertiary amine, an organometallic compound, an organophosphorus compound, an imidazole compound, or a boron-containing compounds.

The inorganic filler may include fused silica, crystalline silica, calcium carbonate, magnesium carbonate, alumina, magnesia, clay, talc, calcium silicate, titanium oxide, antimony oxide, or glass fiber.

The inorganic filler may include fused spherical silica having an average particle diameter of about 0.001 μm to about 30 μm.

The embodiments may be realized by providing a semiconductor package including a substrate; a semiconductor device mounted on the substrate; a connecting portion electrically connecting the semiconductor device and the substrate; and a molding portion encapsulating the semiconductor device and the connecting portion, wherein the molding portion is prepared from the epoxy resin composition for encapsulating a semiconductor device according to an embodiment.

The semiconductor device may be mounted on the substrate via a die adhesive film, the die adhesive film being a silicon-based adhesive.

BRIEF DESCRIPTION OF THE DRAWING

Features will be apparent to those of skill in the art by describing in detail exemplary embodiments with reference to the attached drawing in which:

FIG. 1 illustrates a schematic sectional view of a semiconductor package in accordance with an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

An epoxy resin composition for encapsulating a semiconductor device according to an embodiment may include, e.g., an epoxy resin (A), a polyorganosiloxane resin (B), a curing agent (C), a curing accelerator (D), and an inorganic filler (E).

Now, each component of the epoxy resin composition will be described in detail.

(A) Epoxy Resin

The epoxy resin may include a suitable epoxy resin that is used for encapsulating semiconductors. In an implementation, the epoxy resin may include an epoxy compound containing at least two epoxy groups.

Examples of the epoxy resin may include epoxy resins obtained by epoxidation of a condensate of a phenol or an alkyl phenol and a hydroxybenzaldehyde. In an implementation, the epoxy resin may include, e.g., phenol novolac type epoxy resins, cresol novolac type epoxy resins, biphenyl type epoxy resins, phenol aralkyl type epoxy resins, multifunctional epoxy resins, naphthol novolac type epoxy resins, novolac type epoxy resins of bisphenol A/bisphenol F/bisphenol AD, glycidyl ethers of bisphenol A/bisphenol F/bisphenol AD, bishydroxybiphenyl epoxy resins, dicyclopentadiene epoxy resins, or the like.

In an implementation, the epoxy resin may include at least one of ortho cresol novolac type epoxy resins, biphenyl type epoxy resins, or phenol aralkyl type epoxy resins.

In an implementation, the epoxy resin may include an ortho-cresol novolac type epoxy resin represented by Formula 1.

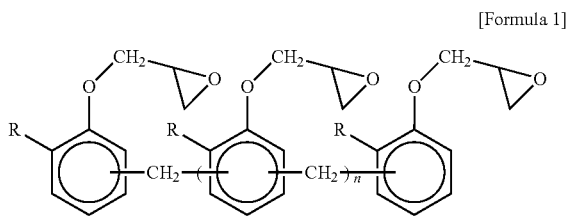

[Formula 1]

In Formula 1, R may be or include, e.g., a methyl group, and n may be, e.g., 0 to about 7 on average.

In an implementation, the epoxy resin may include a phenol aralkyl type epoxy resin represented by Formula 2.

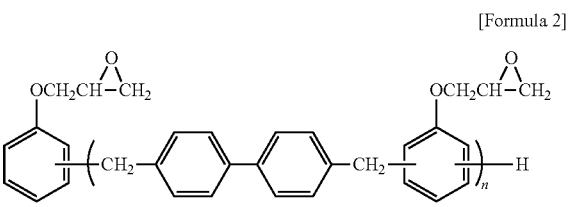

[Formula 2]

In Formula 2, n may be, e.g., about 1 to about 7 on average.

The phenol aralkyl type epoxy resin represented by Formula 2 may have advantages in that the epoxy resin may have excellent moisture absorption, toughness, oxidative resistance, and crack resistance due to formation of a biphenyl structure based on a phenol backbone, and that the epoxy resin may have low crosslinking density and thus form a char layer upon combustion at high temperature, which in turn may help ensure a certain degree of flame retardancy.

The epoxy resins may be used alone or in combination thereof.

In an implementation, the epoxy resin may also be used in the form of an adduct compound, e.g., a melt master batch obtained by pre-reacting with other components, such as a phenol curing agent, a curing accelerator, a release agent, a coupling agent, a strain relief agent, or the like. In an implementation, an epoxy resin containing a low amount of chlorine ions, sodium ions, and/or other ionic impurities may be used in order to help improve reliability in terms of moisture resistance.

The epoxy resin may be present in the composition in an amount of about 2 wt % to about 17 wt %, e.g., about 3 wt % to about 15 wt %, based on a total weight of the epoxy resin composition for encapsulating a semiconductor device. Within this range, the epoxy resin composition may exhibit excellent properties in terms of flowability, flame retardancy, and reliability. In an implementation, the epoxy resin may be present in an amount of about, e.g., 2 wt %, 3 wt %, 4 wt %, 5 wt %, 5.9 wt %, 6 wt %, 6.17 wt %, 6.38 wt %, 7 wt %, 8 wt %, 9 wt %, 10 wt %, 11 wt %, 12 wt %, 13 wt %, 14 wt %, 15 wt %, 16 wt %, or 17 wt %.

(B) Polyorganosiloxane Resin

The polyorganosiloxane resin may include a polyorganosiloxane compound, e.g., may be represented by Formula 3.

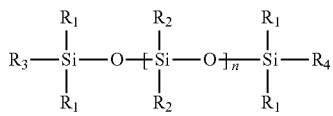

[Formula 3]

In Formula 3, $R_1$, $R_2$, $R_3$, and $R_4$ may each independently be or include, e.g., a substituted or unsubstituted $C_1$ to $C_{10}$ alkyl group, a substituted or unsubstituted $C_3$ to $C_{20}$ cycloalkyl group, a substituted or unsubstituted $C_6$ to $C_{20}$ aryl group, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, a substituted or unsubstituted $C_2$ to $C_{20}$ alkenyl group, a substituted or unsubstituted $C_2$ to $C_{20}$ alkynyl group, a substituted or unsubstituted $C_1$ to $C_{10}$ alkoxy group, an epoxy-substituted organic group, or a hydroxyl-substituted organic group. In an implementation, at least one of $R_3$ or $R_4$ may be or include a vinyl group-containing organic group, e.g., at least one of $R_3$ or $R_4$ may include a $C_2$ to $C_{20}$ alkenyl group. n may be 0 to about 100 on average, e.g., n may be an integer of 0 to about 100.

In an implementation, the polyorganosiloxane resin may be represented by Formula 4.

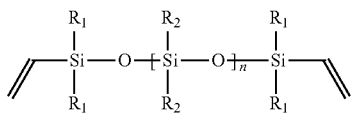

[Formula 4]

In Formula 4, n, $R_1$, and $R_2$ may be the same as defined above with respect to Formula 3.

In an implementation, in Formula 3, at least one $R_2$ may be or include, e.g., an epoxy-substituted or epoxy-containing organic group. The epoxy-substituted organic group may include, e.g., an epoxy-substituted $C_1$ to $C_{30}$ alkyl group, an epoxy-substituted $C_3$ to $C_{30}$ cycloalkyl group, an epoxy-substituted $C_6$ to $C_{30}$ aryl group, an epoxy-substituted $C_7$ to $C_{30}$ arylalkyl group, an epoxy-substituted $C_1$ to $C_{30}$ heteroalkyl group, an epoxy-substituted $C_2$ to $C_{30}$ heterocycloalkyl group, or a combination thereof. In an implementation, the epoxy-substituted organic group may include, e.g., a glycidoxyalkyl group. In an implementation, the epoxy-substituted organic group may include, e.g., a glycidoxypropyl group.

When used in the epoxy resin composition, the polyorganosiloxane resin may exhibit good adhesion to a silicon-based die adhesive for adhesion between a semiconductor device and a substrate, and the polyorganosiloxane resin may help prevent cracking at an interface between an epoxy molding composition and the silicon-based die adhesive, thereby improving reliability.

The polyorganosiloxane resin may be present in the composition in an amount of, e.g., about 0.1 wt % to about 1.0 wt %, based on the total weight of the epoxy resin composition. Within this range, the polyorganosiloxane resin may exhibit improved interface adhesion to the silicon-based die adhesive to increase reliability. Maintaining the amount of the polyorganosiloxane resin at about 1.0 wt % or less may help ensure that continuous processability is not reduced, which could otherwise occur due to deterioration in releasing properties. In an implementation, the polyorganosiloxane resin may be present in an amount of about, e.g., 0.1 wt %, 0.2 wt %, 0.3 wt %, 0.4 wt %, 0.5 wt %, 0.6 wt %, 0.7 wt %, 0.8 wt %, 0.9 wt %, or 1.0 wt %.

(C) Curing Agent

The curing agent may include a suitable curing agent that is used for encapsulating a semiconductor device. For example, the curing agent may contain at least two phenolic hydroxyl groups or amino groups, or the like. In an implementation, the curing agent may include, e.g., a monomer, an oligomer, and/or a polymer.

In an implementation, the curing agent may include, e.g., phenol aralkyl type phenol resins, xylok type phenol resins, phenol novolac type phenol resins, cresol novolac type phenol resins, naphthol type phenol resins, terpene type phenol resins, multifunctional phenol resins, multi aromatic phenol resins, dicyclopentadiene phenol resins, terpene modified phenol resins, dicyclopentadiene modified phenol resins, novolac type phenol resins prepared from bisphenol A and resol, multivalent phenol compounds (including, e.g., tris(hydroxyphenyl)methane and dihydroxybiphenyl), acid anhydrides (including, e.g., maleic anhydride and phthalic anhydride), metaphenylene diamine, diaminodiphenyl methane, and/or diaminodiphenylsulfone.

In an implementation, a phenolaralkyl type phenol resin having a biphenyl backbone represented by Formula 5, or a xylok type phenol resin represented by Formula 6 may be used as the curing agent.

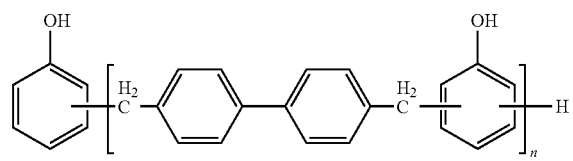

[Formula 5]

In Formula 5, n may be about 1 to about 7 on average.

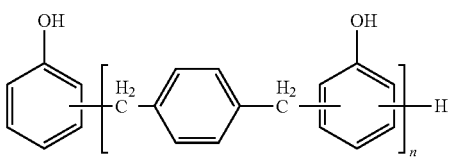

[Formula 6]

In Formula 6, n may be about 1 to about 7 on average.

The curing agent may be used alone or in combination thereof. For example, the curing agent may be used in the form of an adduct compound prepared by pre-reaction, such as melt master batch, of the curing agent with the epoxy resin, a curing accelerator, and other additives.

The curing agent may have a softening point of, e.g., about 50° C. to about 100° C. Within this range, the epoxy resin may have suitable resin viscosity, thereby helping to prevent a deterioration in flowability.

The phenolic hydroxyl group contained in the curing agent may have an equivalent weight of, e.g., about 90 g/eq. to about 300 g/eq. Within this range, the epoxy resin composition may exhibit excellent balance among curability, flame retardancy, and flowability. In an implementation, the phenolic hydroxyl group contained in the curing agent may have an equivalent weight of, e.g., about 100 g/eq. to about 300 g/eq.

In an implementation, a composition ratio of the epoxy resin to the curing agent may be selected such that an equivalent weight ratio of the epoxy group in the epoxy resin to the phenolic hydroxyl group in the curing agent is, e.g., about 0.5:1 to about 2:1. Within this range, flowability of the resin composition may be secured and curing time may not be delayed. In an implementation, the equivalent weight ratio may be, e.g., about 0.8:1 to about 1.6:1.

The curing agent may be present in the composition in an amount of, e.g., about 2 wt % to about 10 wt %, based on the total weight of the epoxy resin composition. Within this range, the resin composition may exhibit excellent flowability, flame retardancy, and reliability, e.g., since the unreacted epoxy group and phenolic hydroxyl group may not remain in large amounts. In an implementation, the curing agent may be present in an amount of about, e.g., 2 wt %, 3 wt %, 4 wt %, 5 wt %, 5.23 wt %, 5.41 wt %, 6 wt %, 7 wt %, 8 wt %, 9 wt %, or 10 wt %.

(D) Curing Accelerator

The curing accelerator may promote the reaction between the epoxy resin and the phenolic curing agent. Examples of the curing accelerator may include a tertiary amine, an organometallic compound, an organophosphorus compound, an imidazole compound, a boron-containing compound, or the like. In an implementation, an organophosphorus compound may be used as the curing accelerator.

Examples of the tertiary amine may include benzyldimethylamine, triethanolamine, triethylenediamine, dimethylaminoethanol, tri(dimethylaminomethyl)phenol, 2-2-(dimethylaminomethyl)phenol, 2,4,6-tris(diaminomethyl) phenol, and salts of tri-2-ethylhexanoic acid. Examples of the organometallic compound may include chromium acetylacetonate, zinc acetylacetonate, and nickel acetylacetonate. Examples of the organophosphorus compound may include tris-4-methoxyphosphine, tetrabutyl phosphonium bromide, butyl triphenyl phosphonium bromide, phenyl phosphine, diphenyl phosphine, triphenyl phosphine, triphenyl phosphine triphenyl borane, and triphenyl phosphine-1,4-benzoquinone adducts. Examples of the imidazole compound may include 2-methylimidazole, 2-phenylimidazole, 2-aminoimidazole, 2-methyl-1-vinylimidazole, 2-ethyl-4-methylimidazole, and 2-heptadecylimidazole. Examples of the boron-containing compound may include tetraphenyl phosphonium tetraphenylborate, triphenyl phosphine tetraphenylborate, tetraphenylborate, trifluoroborane-n-hexylamine, trifluoroborane monoethylamine, tetrafluoroborane triethylamine, and tetrafluoroborane amine. In an implementation, 1,5-diazobicyclo[4.3.0]non-5-ene, 1,8-diazobicyclo[5.4.0] undec-7-ene, phenol novolac resin salts, or the like may be used.

The curing accelerator may be used in the form of an adduct compound prepared through pre-reaction with the epoxy resin and/or the phenolic curing agent.

The curing accelerator may be present in the composition in an amount of, e.g., about 0.001 wt % to about 1.5 wt %, based on the total weight of the epoxy resin composition. Within this range, the time for curing reaction may not be delayed, and flowability of the composition may be ensured. In an implementation, the curing accelerator may be present in an amount of, e.g., about 0.01 wt % to about 1 wt %. In an implementation, the curing accelerator may be present in an amount of about, e.g., 0.001 wt %, 0.01 wt %, 0.1 wt %, 0.15 wt %, 0.16 wt %, 0.2 wt %, 0.3 wt %, 0.4 wt %, 0.5 wt %, 0.6 wt %, 0.7 wt %, 0.8 wt %, 0.9 wt %, or 1 wt %.

(E) Inorganic Filler

The inorganic filler may be included in the epoxy resin composition to help improve mechanical properties and to help reduce strain. Examples of the inorganic filler may include fused silica, crystalline silica, calcium carbonate, magnesium carbonate, alumina, magnesia, clay, talc, calcium silicate, titanium oxide, antimony oxide, and glass fibers. These may be used alone or in combination thereof.

In an implementation, the fused silica (having a low coefficient of linear expansion) may be used, with a view toward strain reduction. In an implementation, the fused silica may refer to amorphous silica having a specific gravity not higher than about 2.3. The fused silica may be prepared by melting crystalline silica or may include amorphous silica prepared from various raw materials.

The shape and particle diameter of the inorganic filler may be a suitable shape and particle diameter. In an implementation, the inorganic filler may have an average particle diameter of, e.g., about 0.001 μm to about 30 μm. In an implementation, the inorganic filler may include, e.g., fused spherical silica having an average particle diameter of about 0.001 μm to about 30 μm. In an implementation, the inorganic filler may include a mixture of fused spherical silica products having different particle diameters. For example, the inorganic filler may include a mixture of about 50 wt % to about 99 wt % of fused spherical having an average particle diameter of about 5 μm to about 30 μm and about 1 wt % to about 50 wt % of fused spherical silica having an average particle diameter of about 0.001 μm to about 1 μm. In an implementation, the particle diameter of the inorganic filler may also be adjusted to a maximum of, e.g., about 45 μm, about 55 μm, or about 75 μm, depending upon the application of the epoxy resin composition.

In an implementation, before use, the inorganic filler may be subjected to surface treatment with at least one coupling agent selected from epoxysilanes, aminosilanes, mercaptosilanes, alkylsilanes, and alkoxysilanes.

The inorganic filler may be included in the composition in a suitable amount with a view toward the desired physical properties of the epoxy resin composition, e.g., moldability, low strain, and high-temperature strength. In an implementation, the inorganic filler may be present in the composition in an amount of, e.g., about 70 wt % to about 94 wt %, based on the total weight of the epoxy resin composition. Within this range, the composition may have excellent flowability and moldability while providing excellent warpage resistance and high reliability for the package. In an implementation, the inorganic filler may be present in an amount of, e.g., about 82 wt % to about 92 wt %, based on the total weight of the epoxy resin composition. In an implementation, the inorganic filler may be present in an amount of about, e.g., 70 wt %, 71 wt %, 72 wt %, 73 wt %, 74 wt %, 75 wt %, 76 wt %, 77 wt %, 78 wt %, 79 wt %, 80 wt %, 81 wt %, 82 wt %, 83 wt %, 84 wt %, 85 wt %, 86 wt %, 87 wt %, 88 wt %, 89 wt %, 90 wt %, 91 wt %, 92 wt %, 93 wt %, or 94 wt %.

Additive

In an implementation, the epoxy resin composition may further include an additive. The additive may include, e.g., colorants, coupling agents, release agents, strain relief agents, cross-linking enhancers, leveling agents, and/or flame retardants.

Examples of the colorant may include carbon black, organic dyes, and inorganic dyes.

The coupling agent may be a silane coupling agent. The silane coupling agent may include, e.g., epoxysilanes, aminosilanes, mercaptosilanes, alkylsilanes, and/or alkoxysilanes.

The release agent may include, e.g., paraffin-based waxes, ester-based waxes, higher fatty acids, metal salts of higher fatty acids, natural fatty acids, and/or metal salts of natural fatty acids.

The strain relief agents may include, e.g., modified silicone oils, silicone elastomers, silicone powders, and/or silicone resins.

The additive may be included in the composition an amount of, e.g., about 0.1 wt % to about 5.5 wt %, based on the total weight of the epoxy resin composition. In an implementation, the additive may be included in an amount of about, e.g., 0.1 wt %, 0.2 wt %, 0.3 wt %, 0.4 wt %, 0.45 wt %, 0.5 wt %, 0.6 wt %, 0.7 wt %, 0.8 wt %, 0.9 wt %, 0.95 wt %, 1 wt %, 1.5 wt %, 2 wt %, 2.5 wt %, 3 wt %, 3.5 wt %, 4 wt %, 4.5 wt %, 5 wt %, or 5.5 wt %.

In an implementation, the epoxy resin composition may further include a flame retardant. The flame retardant may be a non-halogen organic or inorganic flame retardant. Examples of the non-halogen organic or inorganic flame retardant may include phosphazene, zinc borate, aluminum hydroxide, and magnesium hydroxide.

Flame retardancy may vary depending upon the content of the inorganic filler and the type of curing agent, and the flame retardant may be included in the epoxy resin composition in a suitable ratio according to a desired level of flame retardancy. In an implementation, the flame retardant may be present in the composition in an amount of about 10 wt % or less, e.g. about 8 wt % or less or about 5 wt % or less.

The epoxy resin composition according to an embodiment may have a high glass transition temperature and low curing shrinkage, thereby allowing excellent warpage resistance of the package. Furthermore, the composition may exhibit excellent adhesion to various other materials constituting the semiconductor package and high moisture absorption resistance, thereby providing excellent reliability, while ensuring excellent flame retardancy without using halogen flame retardants.

The epoxy resin composition may be prepared by a suitable process, e.g., homogenizing the components using a Henschel mixer or a Ploughshare mixer, followed by melt kneading at about 90° C. to about 120° C. using a roll mill or a kneader, and then cooling and crushing. Encapsulation of a semiconductor device using the epoxy resin composition may be performed by low-pressure transfer molding. In an implementation, compression molding, injection molding, or cast molding may also be used. By such a process, semiconductor devices including, e.g., a copper lead frame, an iron lead frame, or a lead frame obtained by pre-plating at least one selected from nickel, copper, and palladium onto the above-mentioned lead frame, or an organic laminate frame may be produced.

The embodiments may provide a semiconductor device encapsulated using the epoxy resin composition as set forth above.

In an implementation, encapsulating a semiconductor package may be performed through selection of a suitable molding machine according to a determined molding process, encapsulation molding and curing of a semiconductor device package using the prepared epoxy resin composition in the molding machine, and post-molding curing of the molded semiconductor device package. Encapsulation molding may be performed, e.g., at about 160° C. to about 190° C. for about 40 seconds to about 300 seconds, and post-molding curing may be performed at about 160° C. to about 190° C. for about 0 to 8 hours.

Semiconductor Package

In accordance with an embodiment, a semiconductor package may include, e.g., a substrate; a semiconductor device mounted on the substrate; a connecting portion electrically connecting the semiconductor device and the substrate; and a molding portion encapsulating the semiconductor device and the connecting portion.

The molding portion may be formed of or prepared from the epoxy resin composition for encapsulating a semiconductor device as set forth above.

The semiconductor device may be provided in plural and mounted on the substrate via a die adhesive film.

FIG. 1 illustrates a schematic sectional view of a semiconductor package 100 in accordance with an embodiment. Referring to FIG. 1, the semiconductor package 100 may be a board-on-chip (BOC) type semiconductor package, and may include a substrate 110, a die adhesive film 130 placed on the substrate 110, a semiconductor device 120 on the substrate 110 and attached to the substrate 110 through the die adhesive film 130, a connecting portion 150, e.g., a bonding wire, for mutual electric connection of the semiconductor device 120 and the substrate 110, a molding portion 140 encapsulating the semiconductor device 120 and the connecting portion 150, and protecting a mount structure including the substrate 110, the semiconductor device 120 mounted on the substrate 110, and the connecting portion 150.

A plurality of solder balls 160 for electric connection of the semiconductor device 120 to an outer circuit (not shown) may be formed on a surface of the substrate facing a mount surface of the substrate with the semiconductor device 120 mounted thereon.

The molding portion 140 may be formed on the substrate 110 to completely cover the semiconductor device 120 and the connecting portion 150.

The molding portion 140 may include or may be prepared from the epoxy resin composition for encapsulating a semiconductor device. In an implementation, the die adhesive film 130 may be a silicon-based die adhesive film.

When the silicon-based die adhesive is used as the die adhesive film for mounting the semiconductor device, the silicon-based die adhesive may provide improved adhesion and crack resistance through hydrosilylation between the silicon-based die adhesive and the epoxy resin composition, thereby allowing maintenance of high reliability.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES AND COMPARATIVE EXAMPLES

Details of the components used in Examples and Comparative Examples were as follows.

(A) Epoxy Resin

An ortho cresol novolac epoxy resin (EOCN-1020-55, Nippon Kayaku Co., Ltd.) was used.

(B) Polyorganosiloxane Resin

In the Preparative Example, described below, a polyorganosiloxane resin represented by Formula 7 was prepared and used.

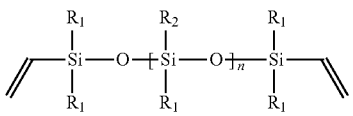

[Formula 7]

In the polyorganosiloxane resin represented by Formula 7, $R_1$ is a methyl group, $R_2$ is a glycidoxypropyl group and n is 0 to about 100 on average.

(C) Curing Agent

A xylok type phenol resin (HE100C-10, Air Water Co., Ltd.) was used.

(D) Curing Accelerator

Triphenylphosphine TPP (Hokko Co., Ltd.) was used.

(E) Inorganic Filler

A mixture of fused spherical silica having an average particle diameter of 16 μm and fused spherical silica having an average particle diameter of 0.5 μm in a weight ratio of 9:1 was used.

(F) Coupling Agent

A mixture of (f1) mercaptopropyltrimethoxysilane (KBM-803, Shinetsu Co., Ltd.) and (f2) methyltrimethoxysilane (SZ-6070, Dow Corning Chemical Co., Ltd.) was used.

(G) Additive (g1) Carnauba wax as a release agent, and (g2) carbon black (MA-600, Matsushita Chemical Co., Ltd.) as a colorant were used.

Preparative Example

With 1 kg of a mixed solution of water and isopropyl alcohol mixed in a weight ratio of 5:5 placed in a 3-neck flask, 300 g of glycidoxypropyldimethoxymethylsilane was dropped together with 0.1 mole of nitric acid for 1 hour while maintaining the flask at 65° C. After dropping, the flask was heated to 75° C. for 4 hours, followed by introducing 40 g of methoxydimethylvinylsilane. Then, after cooling the mixture solution to ambient temperature, a water layer was removed from the mixed solution, thereby preparing a siloxane solution dissolved in isopropyl alcohol. Thereafter, the obtained siloxane solution was washed with water to remove a by-product, i.e. organic acid. Then, the siloxane solution was subjected to distillation under reduced pressure to remove isopropyl alcohol, thereby obtaining polyorganosiloxane represented by Formula 7.

Examples 1 to 3 and Comparative Examples 1 to 3

The components were weighed in amounts as listed in Table 1 and homogenized using a Henschel mixer. Subsequently, the mixture was melt kneaded at 90° C. to 110° C. using a continuous kneader, followed by cooling and crushing, thereby preparing an epoxy resin composition for encapsulation of a semiconductor device. The composition was evaluated as to properties as follows. Results are shown in Table 1.

Evaluation of Physical Properties (1) Spiral flow (inch): Flow length (unit: inch) was measured at a molding temperature of 175° C. and a molding pressure of 70 kgf/cm² using an evaluation mold prepared in accordance with EMMI.

(2) Glass transition temperature (Tg) and Coefficient of thermal expansion (μm/m): Glass transition temperature and coefficient of thermal expansion were measured using a thermo-mechanical analyzer (TMA) while increasing temperature at 10° C./min.

(3) Releasing force: Semiconductor packages (200FBGA, 0.22 t, SSE) were continuously molded under conditions of a mold temperature of 175° C., an injection pressure of 9.3 MPa, and a curing time of 90 seconds using a transfer molding press. Releasing failure was determined based on the number of shots until molding failure, such as gate clogging, air vent clogging, package separation from the mold, cull falling, occurred. Results are shown in Table 1.

(4) Adhesion

With a silicon-based die adhesive (DA-6633, Dow corning Chemical Co., Ltd.) uniformly applied to a PSR layer of a PCB (200FBGA, 0.22 t, SSE) to a thickness of 20 μm, each of the resin compositions prepared in the Examples and Comparative Examples, having a diameter of 3 mm, was molded on the PCB having a size of 30 mm×30 mm, thereby obtaining a cured specimen. The cured specimen was subjected to post-molding curing (PMC) in an oven at 175° C. for 4 hours, and left at 85° C. and 85% RH for 168 hours. Then, the specimen was passed through IR reflow once at 260° C. for 30 seconds. The procedure was repeated three times under pre-conditioning conditions. Each of the specimens after PMC and the specimens after pre-conditioning treatment was evaluated as to adhesion using a die shear tester (Dage 4000, DS-200 load cell).

(5) Crack Resistance Evaluation: Reliability Evaluation

A semiconductor package was assembled using each of the resin compositions prepared in the Examples and Comparative Examples, followed by post-molding curing at 175° C. for 4 hours. In the prepared semiconductor package, a semiconductor device was mounted on a substrate via a silicon-based die adhesive (DA-6633, Dow Corning Chemical Co., Ltd.). The semiconductor package was dried at 125° C. for 24 hours and left at 85° C. and 85% RH for 168 hours. Then, the semiconductor package was passed through IR reflow once at 260° C. for 30 seconds. The procedure was repeated three times under pre-conditioning conditions. Thereafter, occurrence of cracking at an interface between a molding portion and the die adhesive film was evaluated using a non-destructive inspection apparatus C-SAM (Scanning Acoustic Microscopy).

TABLE 1

| Component | | Example 1 | Example 2 | Example 3 | Comparative Example 1 | Comparative Example 2 | Comparative Example 3 |
|---|---|---|---|---|---|---|---|
| (A) Epoxy resin | | 6.38 | 6.17 | 5.9 | 6.44 | 6.41 | 5.37 |
| (B) Polyorganosiloxane resin | | 0.1 | 0.5 | 1 | — | 0.05 | 2 |
| (C) Curing agent | | 5.41 | 5.23 | 5 | 5.45 | 5.43 | 4.55 |
| (D) Curing accelerator | | 0.16 | 0.15 | 0.15 | 0.16 | 0.16 | 0.13 |
| (E) Inorganic filler | | 87 | 87 | 87 | 87 | 87 | 87 |
| (F) Coupling agent | (f1) | 0.3 | 0.3 | 0.3 | 0.3 | 0.3 | 0.3 |
| | (f2) | 0.15 | 0.15 | 0.15 | 0.15 | 0.15 | 0.15 |

TABLE 1-continued

| Component | | Example 1 | Example 2 | Example 3 | Comparative Example 1 | Comparative Example 2 | Comparative Example 3 |
|---|---|---|---|---|---|---|---|
| (G) Additive | (g1) | 0.3 | 0.3 | 0.3 | 0.3 | 0.3 | 0.3 |
| | (g2) | 0.2 | 0.2 | 0.2 | 0.2 | 0.2 | 0.2 |
| Spiral flow (inch) | | 58 | 61 | 63 | 57 | 58 | 71 |
| Glass transition temperature Tg (° C.) | | 135 | 133 | 134 | 135 | 134 | 130 |
| Coefficient of thermal expansion α1 (μm/m) | | 10.7 | 9.8 | 9.2 | 10.1 | 10.3 | 9.1 |
| Coefficient of thermal expansion α2 (μm/m) | | 36.9 | 38.1 | 39.2 | 37.2 | 38.2 | 41.2 |
| Continuous moldability (number) | | >500 | >500 | >500 | >500 | >500 | 320 |
| Adhesion | After PMC | 25 | 31 | 35 | 21 | 22 | 39 |
| | After being left at 85° C./85% For 168 hrs | 23 | 29 | 31 | 12 | 15 | 33 |
| Crack resistance (C-SAM) | Before Reflow | 0/200 | 0/200 | 0/200 | 0/200 | 0/200 | 0/200 |
| | After Reflow | 0/200 | 0/200 | 0/200 | 18/200 | 3/200 | 0/200 |

As shown in Table 1, it may be seen that the resin compositions prepared in Examples 1 to 3 exhibited excellent adhesion and high crack resistance.

Conversely, the resin composition prepared without the polyorganosiloxane resin (in Comparative Example 1) and the resin composition prepared using only a slight amount of the polyorganosiloxane resin (in Comparative Example 2) exhibited much lower adhesion and crack resistance than those of Examples 1 to 3. In addition, the resin composition prepared using an excess of the polyorganosiloxane resin (in Comparative Example 3) exhibited low releasing force, causing deterioration in continuous processability.

By way of summation and review, as a semiconductor package becomes light, thin, and miniaturized, the semiconductor package may experience warpage due to difference in coefficient of thermal expansion between the semiconductor chip, lead frame, and epoxy resin composition constituting the package, and thermal shrinkage and curing shrinkage of the epoxy resin composition for encapsulating the package. Warpage of the package may cause soldering defects upon soldering in a semiconductor post-process and thus electrical failure. An epoxy resin composition for encapsulation of a semiconductor device having excellent warpage resistance may be desirable.

In order to enhance warpage (prevention) properties of epoxy resin compositions, a method of increasing glass transition temperature of epoxy resin compositions, a method of lowering curing shrinkage of epoxy resin compositions, or the like may be considered.

In the course of mounting a semiconductor package on a substrate, the package may be exposed to high temperature (e.g., 260° C.), whereby any moisture present inside the package may be subjected to rapid volume expansion, thereby causing delamination inside the package or fracture outside the package. Accordingly, in order to help prevent such a phenomenon, a decrease in the moisture absorption rate of the epoxy resin composition for encapsulation may help ensure reliability. When increasing the glass transition temperature of the epoxy resin composition in order to help improve warpage (prevention) properties, the moisture absorption rate of the epoxy resin composition may be increased, thereby causing deterioration in reliability of the package. Therefore, in the case of a package having poor reliability, increase of the glass transition temperature to enhance warpage (prevention) properties may be restricted.

In order to help reduce curing shrinkage of the epoxy resin composition, it is possible to increase the amount of inorganic filler having a low coefficient of thermal expansion. However, when the amount of inorganic filler is increased, the epoxy resin composition may experience a reduction in flowability, causing limitation in increase of the concentration of inorganic filler.

For example, silicon-based die attach adhesives or a silicon-based die attach films used in the semiconductor field may demonstrate fast curing properties, unlike epoxy-based curable die adhesives, and may realize adhesion by momentary pressure and heat. For example, the silicon-based die adhesives attracted attention due to advantages of the silicon-based resin, i.e. flexibility of a cured composition having been formed therefrom after curing. However, with the development of epoxy molding, application of the silicon-based die adhesives may be relatively limited. For example, in the case of surface mount type board-on-chip (BOC) semiconductor packages, the silicon-based die adhesives may increasingly be used to shorten process time, instead of the epoxy die adhesives which may require a long time to cure.

Condensation curable silicon-based compositions may exhibit better adhesion than addition curable silicon-based compositions. However, a condensation reaction may form adducts, and thus may cause formation of pores, thereby causing reliability failure. Thus, the addition curable compositions may be suitable for semiconductors. However, when the addition curable compositions are used as an adhesive composition for semiconductor chips, an interface between the adhesive and an epoxy molding compound (EMC) may exhibit lack of adhesion, thereby causing reliability failure.

The embodiments may provide an epoxy resin composition for encapsulating a semiconductor device, which has excellent adhesion to silicon-based die adhesives and high crack resistance after encapsulation of the semiconductor device, thereby securing sufficient reliability.

For example, the epoxy resin composition for encapsulating a semiconductor device according to an embodiment may exhibit high crack resistance and excellent adhesion to a semiconductor device and a silicon-based die adhesive, and the semiconductor package encapsulated using the epoxy resin composition may have high reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An epoxy resin composition for encapsulating a semiconductor device, the composition comprising:
   an epoxy resin;
   a polyorganosiloxane resin represented by Formula 4, below;
   a curing agent;
   a curing accelerator; and
   an inorganic filler,

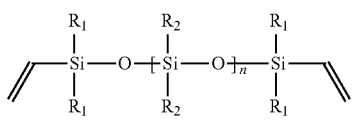

wherein:
$R_1$ and $R_2$ each independently include a substituted or unsubstituted $C_1$ to $C_{10}$ alkyl group, a substituted or unsubstituted $C_3$ to $C_{20}$ cycloalkyl group, a substituted or unsubstituted $C_6$ to $C_{20}$ aryl group, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, a substituted or unsubstituted $C_2$ to $C_{20}$ alkenyl group, a substituted or unsubstituted $C_2$ to $C_{20}$ alkynyl group, a substituted or unsubstituted $C_1$ to $C_{10}$ alkoxy group, an epoxy-substituted organic group, or a hydroxyl-substituted organic group;
n is 0 to about 100 on average, and
the polyorganosiloxane resin is present in the composition in an amount of about 0.1 wt % to about 1.0 wt %, based on a total weight of the composition.

2. The epoxy resin composition as claimed in claim 1, wherein, in Formula 4, at least one $R_2$ is an epoxy-substituted organic group.

3. The epoxy resin composition as claimed in claim 1, wherein the composition includes:
   about 3 wt % to about 15 wt % of the epoxy resin;
   the about 0.1 wt % to about 1.0 wt % of the polyorganosiloxane resin;
   about 2 wt % to about 10 wt % of the curing agent;
   about 0.01 wt % to about 1.0 wt % of the curing accelerator; and
   about 82 wt % to about 92 wt % of the inorganic filler, all wt % being based on the total weight of the composition.

4. The epoxy resin composition as claimed in claim 1, wherein the epoxy resin includes at least one of an ortho-cresol novolac epoxy resin represented by Formula 1 or a phenolaralkyl epoxy resin represented by Formula 2:

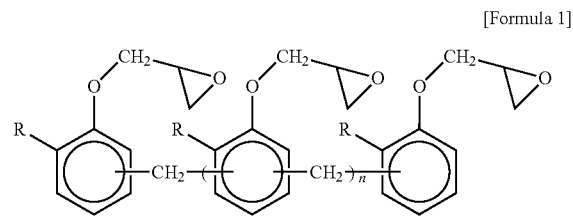

wherein, in Formula 1, R is a $C_1$ to $C_4$ alkyl group and n is 0 to about 7 on average,

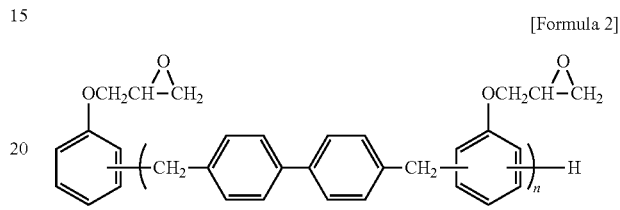

wherein, in Formula 2, n is about 1 to about 7 on average.

5. The epoxy resin composition as claimed in claim 1, wherein the curing agent includes a phenolaralkyl type phenol resin, a xylok type phenol resin, a phenol novolac type phenol resin, a cresol novolac type phenol resin, a naphthol type phenol resin, a terpene type phenol resin, a polyfunctional phenol resin, a polyaromatic phenol resin, a dicyclopentadiene phenol resin, a terpene modified phenol resin, a dicyclopentadiene modified phenol resin, a novolac type phenol resin prepared from bisphenol A and resol, a multivalent phenol compound, an acid anhydride, metaphenylenediamine, diaminodiphenylmethane, or diaminodiphenylsulfone.

6. The epoxy resin composition as claimed in claim 1, wherein the curing accelerator includes a tertiary amine, an organometallic compound, an organophosphorus compound, an imidazole compound, or a boron-containing compound.

7. The epoxy resin composition as claimed in claim 1, wherein the inorganic filler includes fused silica, crystalline silica, calcium carbonate, magnesium carbonate, alumina, magnesia, clay, talc, calcium silicate, titanium oxide, antimony oxide, or glass fiber.

8. The epoxy resin composition as claimed in claim 1, wherein the inorganic filler includes fused spherical silica having an average particle diameter of about 0.001 μm to about 30 μm.

9. A semiconductor package, comprising:
   a substrate;
   a semiconductor device mounted on the substrate;
   a connecting portion electrically connecting the semiconductor device and the substrate; and
   a molding portion encapsulating the semiconductor device and the connecting portion,
   wherein the molding portion is prepared from the epoxy resin composition for encapsulating a semiconductor device as claimed claim 1.

10. The semiconductor package as claimed in claim 9, wherein the semiconductor device is mounted on the substrate via a die adhesive film, the die adhesive film being a silicon-based adhesive.